United States Patent
Tsedek

(10) Patent No.: US 12,288,668 B2
(45) Date of Patent: Apr. 29, 2025

(54) ENTROPY BASED IMAGE PROCESSING FOR FOCUSED ION BEAM DELAYER-EDGE SLICES DETECTION

(71) Applicant: Applied Materials Israel Ltd., Rehovot (IL)

(72) Inventor: Yuval Tsedek, Rehovot (IL)

(73) Assignee: Applied Materials Israel Ltd., Rehovot (IL)

( * ) Notice: Subject to any disclaimer, the term of this patent is extended or adjusted under 35 U.S.C. 154(b) by 200 days.

(21) Appl. No.: 18/196,396

(22) Filed: May 11, 2023

(65) Prior Publication Data

US 2024/0379327 A1 Nov. 14, 2024

(51) Int. Cl.
*H01J 37/28* (2006.01)

(52) U.S. Cl.
CPC ......... *H01J 37/28* (2013.01); *H01J 2237/221* (2013.01); *H01J 2237/2803* (2013.01); *H01J 2237/31749* (2013.01)

(58) Field of Classification Search
CPC .. H01J 37/00; H01J 37/02; H01J 37/26; H01J 37/28; H01J 37/22; H01J 37/222; H01J 2237/221; H01J 2237/2803; H01J 2237/31749; H01J 2237/30466
USPC ........ 250/306, 307, 310, 311, 492.1, 492.21, 250/492.3
See application file for complete search history.

(56) References Cited

U.S. PATENT DOCUMENTS

| 5,502,710 A | * | 3/1996 | Washizawa ............... G06T 5/20 369/126 |
| 11,199,401 B1 | | 12/2021 | Zur |
| 2006/0219953 A1 | * | 10/2006 | Carleson ............ G01N 23/2251 250/492.21 |
| 2015/0136977 A1 | | 5/2015 | Buxbaum |

(Continued)

FOREIGN PATENT DOCUMENTS

| JP | 2008511115 A | 4/2008 |
| KR | 20210027497 A | 3/2021 |

OTHER PUBLICATIONS

PCT/US2024/024262, "International Search Report and Written Opinion", Aug. 7, 2024, 10 pages.

*Primary Examiner* — Jason L McCormack
(74) *Attorney, Agent, or Firm* — Kilpatrick Townsend & Stockton LLP

(57) ABSTRACT

A method of delayering a sample that includes a second layer formed under a first layer, where the first and second layers are different materials or different texture, the method including: acquiring a plurality of gray scale images of the region of interest in an iterative process by alternating a sequence of delayering the region of interest with a first charged particle beam and imaging a surface of the region of interest with a second charged particle beam; after each iteration of acquiring a gray scale image, calculating an entropy of the acquired gray scale image and calculating a second derivative of the entropy; determining whether a transition from the first layer to the second layer occurred based on the second derivative of the entropy; and if it is (Continued)

determined that a transition from the first layer to the second layer did not occur, proceeding with a next iteration of acquiring a plurality of gray scale images, and if it is determined that a transition from the first layer to the second layer did occurred, end pointing the delayering process.

20 Claims, 11 Drawing Sheets

(56) References Cited

U.S. PATENT DOCUMENTS

| | | |
|---|---|---|
| 2016/0181061 A1 | 6/2016 | Kim et al. |
| 2022/0223445 A1 | 7/2022 | Avishai et al. |
| 2022/0415610 A1 | 12/2022 | Blayvas |
| 2023/0104390 A1 | 4/2023 | Zur |

* cited by examiner

ENTROPY BASED IMAGE PROCESSING FOR FOCUSED ION BEAM DELAYER-EDGE SLICES DETECTION

BACKGROUND OF THE INVENTION

In the study of electronic materials and processes for fabricating such materials into an electronic structure, a sample of the electronic structure can be used for microscopic examination for purposes of failure analysis and device validation. For instance, a sample such as a silicon wafer that includes one or more electronic structures formed thereon can be milled and analyzed with a focused ion beam (FIB) to study specific characteristics of the structures formed on the wafer.

Many modern electronic structures include many different alternating layers of material in one or more portions of the structure. Removing one or more selected layers to analyze or study characteristics of a structure on the sample formed with the multiple layers is known as delayering and can be done with a FIB tool.

In some instances it is important to reliably locate the interface between different layers of material in a sample. For example, it may be important to mill a hole fully through one or more layers of a sample to image a feature or other layer buried deep within the sample. In order to do such, an end point detection technique can be employed to determine when the milling operation reaches a transition between different layers.

A variety of different end point detection techniques have been developed and can be successfully used to detect the transition between layers in many different scenarios. For example, some end point detection techniques evaluate one or more signals that are dependent on the material being milled, such as secondary electron yield, secondary ion flux and others. Thus, when alternating layers of material are deposited over a semiconductor wafer that yield different numbers of electrons when milled, such existing end point detection techniques can monitor signals representing secondary electron yield, secondary ion flux or other determinative criteria to determine which layer of material is currently being milled. Knowing the manufacturing process used to fabricate the sample then allows the evaluation tool to determine when a layer of material A is milled through and the milling process reaches a layer of a different material, material B.

Despite the availability of such previously developed end point detection techniques, new techniques are desirable.

BRIEF SUMMARY OF THE INVENTION

Embodiments of the disclosure pertain to techniques that enable the transition between two different layers in sample to be detected while delayering materials or regions of a sample and can provide improved end point detection results in situations where currently available end point detection techniques are insufficient. In some embodiments, scanning electron microscope (SEM) images are taken at multiple intervals during a delayering process. Changes in the second derivative of the brightness entropy can then be analyzed to identify the transition from a first layer of a first type of material to a second layer of a second type of material, different than the first type, as described in detail below. Embodiments are useful in determining layer transitions in many different types of samples, including among others, electronic circuits formed on semiconductor structures, solar cells formed on a polycrystalline or other substrate, nanostructures formed on various substrates and the like.

In some embodiments, a method of delayering a sample that includes a second layer formed under a first layer, where the first and second layers are different materials or different texture is provided. The method can include: acquiring a plurality of gray scale images of the region of interest in an iterative process by alternating a sequence of delayering the region of interest with a first charged particle beam and imaging a surface of the region of interest with a second charged particle beam; after each iteration of acquiring a gray scale image, calculating an entropy of the acquired gray scale image and calculating a second derivative of the entropy; determining whether a transition from the first layer to the second layer occurred based on the second derivative of the entropy; and if it is determined that a transition from the first layer to the second layer did not occur, proceeding with a next iteration of acquiring a plurality of gray scale images, and if it is determined that a transition from the first layer to the second layer did occurred, end pointing the delayering process.

In some embodiments, a method of delayering a sample that has a second layer formed under a first layer, where the first and second layers are different materials or different textures includes: transferring the sample into a vacuum chamber of an evaluation tool that includes a scanning electron microscope (SEM) column and a focused ion beam (FIB) column; performing a plurality of delayering operations and generating a corresponding plurality of gray scale images by: (i) positioning the sample under a field of view of the FIB column and delayering a region of interest on the sample by repeatedly scanning a focused ion beam generated by the FIB column across the region of interest; (ii) thereafter, positioning the sample so that the region of interest is under a field of view of the SEM column and generating a gray scale SEM image of the region of interest by scanning an electron beam across the region of interest; (iii) generating a brightness histogram of the gray scale image; (iv) calculating an entropy of the gray scale image from the brightness histogram; (v) calculating a smoothed entropy function previous entropy calculations; (vi) calculating a second derivative of the entropy from the smoothed entropy function; and (vii) determining whether a transition from the first layer to the second layer occurred based on the second derivative of the entropy, and if it is determined that a transition from the first layer to the second layer did not occur, repeating steps (i) to (vii) and if it is determined that a transition from the first layer to the second layer occurred, stopping the delayering process.

In some embodiments, a system for delayering a sample is provided where the system includes: a vacuum chamber; a sample support configured to hold a sample within the vacuum chamber during a sample evaluation process; a focused ion beam (FIB) column configured to direct a first charged particle beam into the vacuum chamber; a scanning electron microscope (SEM) column configured to direct a second charged particle beam into the vacuum chamber; and a processor and a computer-readable memory coupled to the processor. The computer-readable memory can include a plurality of computer-readable instructions that, when executed by the processor, cause the system to: acquire a plurality of gray scale images of the region of interest in an iterative process by alternating a sequence of delayering the region of interest with a first charged particle beam and imaging a surface of the region of interest with a second charged particle beam; after each iteration of acquiring a gray scale image, calculate an entropy of the acquired gray scale image and calculating a second derivative of the entropy; determine whether a transition from the first layer to the second layer occurred based on the second derivative of the entropy; and if it is determined that a transition from the first layer to the second layer did not occur, proceed with a next iteration of acquiring a plurality of gray scale images, and if it is determined that a transition from the first layer to the second layer did occurred, end point the delayering process.

In still other embodiments, a non-transitory computer-readable memory is provided. The computer-readable memory stores instructions for delayering a sample by: acquiring a plurality of gray scale images of the region of interest in an iterative process by alternating a sequence of delayering the region of interest with a first charged particle beam and imaging a surface of the region of interest with a second charged particle beam; after each iteration of acquiring a gray scale image, calculating an entropy of the acquired gray scale image and calculating a second derivative of the entropy; determining whether a transition from the first layer to the second layer occurred based on the second derivative of the entropy; and if it is determined that a transition from the first layer to the second layer did not occur, proceeding with a next iteration of acquiring a plurality of gray scale images, and if it is determined that a transition from the first layer to the second layer did occurred, end pointing the delayering process.

In various implementations, embodiments can include one or more of the following features. After each iteration of acquiring a gray scale image, a brightness histogram of the gray scale image can be calculated. The entropy of the gray scale image can be calculated from brightness histogram. After calculating an entropy of a gray scale image, a smoothed function of the entropy for the gray scale images acquired during and prior to the current iteration can be calculated. The second derivative of the entropy can be calculated at each iteration from the smoothed function of the entropy. Transitions from the first layer to the second layer can be determined based on minima and maxima in the second derivative of the entropy. End pointing the delayering process can include, after determining that a transition from the first layer to the second layer occurred, milling a predetermined number of additional slices and then stopping the delayering process. The first charged particle beam can be an ion beam generated by a focused ion beam column and the second charged particle beam can be an electron beam generated by a scanning electron microscope column. Prior to acquiring the plurality of gray scale images, the sample can be positioned within a vacuum chamber of an evaluation tool that includes the focused ion beam column and the scanning electron microscope (SEM) column. Acquiring the plurality of gray scale images of the region of interest can include moving the sample between the focused ion beam column and scanning electron microscope column during each iteration of the delayering process.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION OF THE INVENTION

In image processing, entropy is a statistical measure of randomness that can be used to characterize the texture of an image. The entropy of a grayscale or other image can be calculated in accordance with a known formula. Embodiments of the disclosure pertain to techniques that can use the calculated entropy of SEM images taken during a delayering process to detect the transition between two different layers in a sample. Specifically, and as discussed in detail below, embodiments can identify the edge slices of a layer based on detecting the minima/maxima of the second derivative of the entropy in a series of SEM images taken at intervals throughout the delayering process.

In this manner, embodiments offer an alternative approach to end pointing a delayering process that can be provide improved results in situations where currently available end point detection techniques are insufficient. In order to better understand and appreciate the embodiments disclosed herein, however, a description of a sample evaluation system in which a delayering process can be implemented, and in which SEM images from which entropy can be calculated, is first provided.

Example Sample Evaluation Tool

Figure 1:
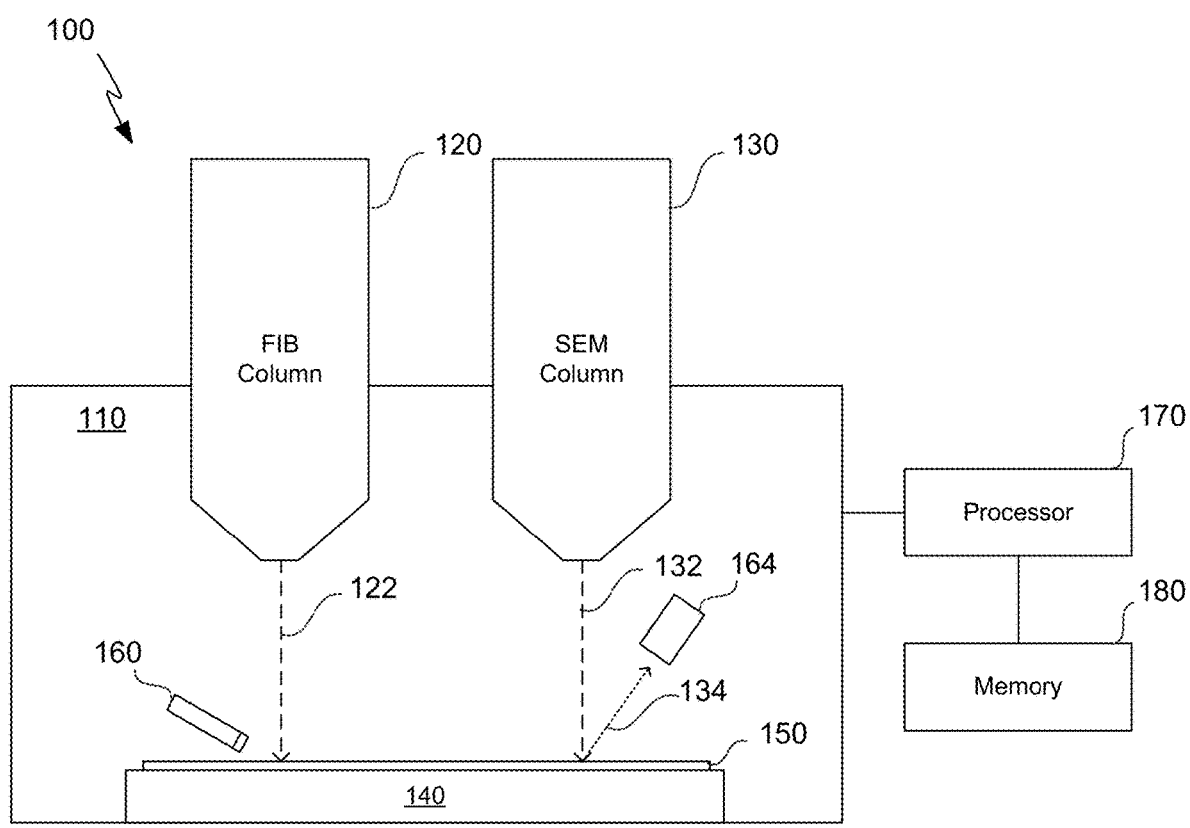
FIG. 1 is simplified illustration of a sample evaluation system according to some embodiments of the disclosure.

FIG. 1 is a simplified schematic illustration of a sample evaluation system 100 in accordance to some embodiments of the disclosure. Sample evaluation system 100 can be used for, among other operations, defect review and analysis of structures formed on samples such as semiconductor wafers and can be used to identify the transition between two adjacent layers in accordance with embodiments disclosed herein.

As shown in FIG. 1, sample evaluation system 100 can include, among other elements, a vacuum chamber 110, a focused ion beam (FIB) column 120, a scanning electron microscope (SEM) column 130, a sample supporting element 140, a gas injection nozzle 160 and secondary electron detector 164. FIB column 120 and SEM column 130 are connected to vacuum chamber 110 so that a charged particle beam generated by either one of the charged particle columns propagates through a vacuumed environment formed within vacuum chamber 110 before impinging on sample 150. For example, FIB column 120 is operable to generate a charged particle beam 122 and direct the charged particle beam 122 towards a sample 150 (sometimes referred to herein as an "object" or a "specimen") to mill or otherwise process the sample. SEM column 130 can generate an image of a portion of sample 150 by illuminating the sample with a charged particle beam 132, detecting particles emitted due to the illumination, and generating charged particle images based on the detected particles.

The sample 150, for example a semiconductor wafer, can be supported on the sample supporting element 140 within vacuum chamber 110. Sample supporting element 140 can also move regions of the sample within vacuum chamber 110 between the field of view of the two charged particle columns 120 and 130 as required for processing. For example, the FIB column 120 can be used to mill a region on the sample 150 and the supporting element 140 can then move the sample so that the SEM column 130 can image the milled region of the sample 150.

FIB column 120 can mill (e.g., drill a hole in) sample 150 by irradiating the sample with one or more charged particle beams to form a cross section or a hole. An FIB milling process typically operates by positioning the specimen in a vacuum chamber 110 and emitting a beam of ions towards the specimen to etch or mill away material on the specimen. Common milling processes form a cross section of the sample 150 and, if desired, can also smooth the cross section. In some instances, the vacuum environment can be purged with background gases that serve to control the etch speed and other parameters. The accelerated ions can be generated from Xenon, Gallium or other appropriate elements and are typically accelerated towards the specimen by voltages in the range of 500 volts to 100,000 volts, and more, typically falling in the range of 3,000 volts to 30,000 volts. The beam current is typically in the range from several pico amps to several micro amps, depending on the FIB instrument configuration and the particular application, and the pressure is typically controlled between $10^{-10}$ to $10^{-5}$ mbar in different parts of the system and in different operation modes.

During a milling operation, the charged particle beam 122 generated by the FIB column 120 propagates through a vacuum environment formed within vacuum chamber 110 before impinging on the sample 150. When delayering a sample, charged particle beam 122 is typically scanned back-and-forth (e.g., in a raster scan pattern) at a constant rate across a particular area of the sample being milled. One or more lenses (not shown) coupled to the charged particle column can implement the scan pattern as is known to those of skill in the art. The area scanned is typically a very small fraction of the overall area of sample. For example, the sample can be a semiconductor wafer with a diameter of 150, 200 or 300 mm while each area scanned on the wafer can be a rectangular area having a width and/or length measured in microns or tens of microns. Each iteration of the scanning process removes a minute amount of material from the surface of sample. Thus, in order to delayer a typical slice of the sample (e.g., a 20-100 nm deep slice), the charged particle beam can be scanned across the region being milled multiple times (e.g., hundreds or thousands of times) to remove a desired amount of material prior to imaging the milled region after the slice is removed.

During a particle imaging operation, the charged particle beam 132 generated by the SEM column 130 propagates through the vacuum environment formed within the vacuum chamber 110 before impinging on the sample 150. Secondary electrons 134 are generated in the collision of electrons with the sample 150 and can be detected by the detector 164. The detected secondary electrons 134 can be used to form images of the milled area and/or to analyze characteristics of the milled layers and the structure. Similar to a milling operation, an imaging operation can scan charged particle beam 132 back-and-forth in a raster or other scan pattern and at a constant rate across a particular area of the sample being imaged and one or more lenses (not shown) coupled to the charged particle column can implement the scan pattern as is known to those of skill in the art.

During some processing operations, one or more gases can be delivered into chamber 110 by a gas injection system 160. For simplicity of explanation gas injection system 160 is illustrated in FIG. 1 as a nozzle, but it is noted that gas injection system 160 can include gas reservoirs, gas sources, valves, one or more inlets and one or more outlets, among other elements. In some embodiments gas injection system 160 can be configured to deliver gas to a localized area of sample 150 that is exposed to the charged particle beam as opposed to delivering gas to an entire upper surface of the sample. For example, in some embodiments gas injection system 160 has a nozzle diameter measured in hundreds of microns (e.g., between 400-500 microns) that is configured to deliver gas directly to a relatively small portion of the sample's surface that encompasses the charged particle beam scan pattern or collision zone. In various embodiments, a first gas injection system 160 can be configured to deliver gas to a sample disposed under FIB column 120 and a second gas injection system 160 (not shown) can be configured to deliver gas to a sample disposed under SEM column 130.

As shown in FIG. 1, system 100 can include one or more controllers, processors or other hardware units 170 that control the operation of system 100 by executing computer instructions stored in one or more computer-readable memories 180 as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

Characterizing Texture in an Image

As stated above, entropy, in image processing context, is a statistical measure of randomness that can be used to characterize the texture of an image. Various computer programs exist that can calculate the entropy of a grayscale image. For example, the MATLAB product from Mathworks, includes an "entropy" function in which the input is a grayscale image represented by a numeric array of any dimension and the output is a numeric scalar. The function defines entropy as:

$$-sum(p.*\log2(p)) \quad (1)$$

where p contains the normalized histogram counts from a function that calculates the histogram for the grayscale image. Further details of the MATLAB entropy function can be found at https://www.mathworks.com/help/images/ref/entropy.html which is incorporated by reference herein in its entirety.

Embodiments disclosed herein can calculate the entropy of gray scale images, such as SEM images, and use the second derivative of the calculated entropy to accurately identify when a delayering process transitions from a first material to a second material. That is, embodiments can use the second derivative of the calculated entropy to locate the interface between different layers of material in a sample. That information can then be used to stop the milling process and/or for other purposes.

Figure 2A:
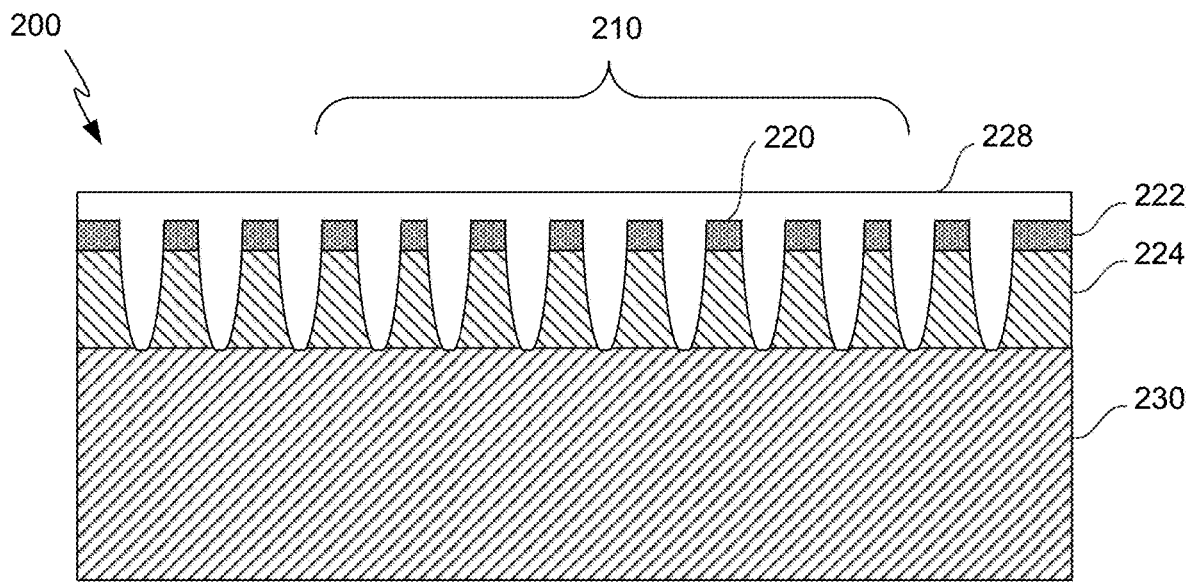
FIG. 2A is a simplified cross-sectional view of a sample having a region of interest that can be evaluated according to embodiments herein.
Figure 2B:
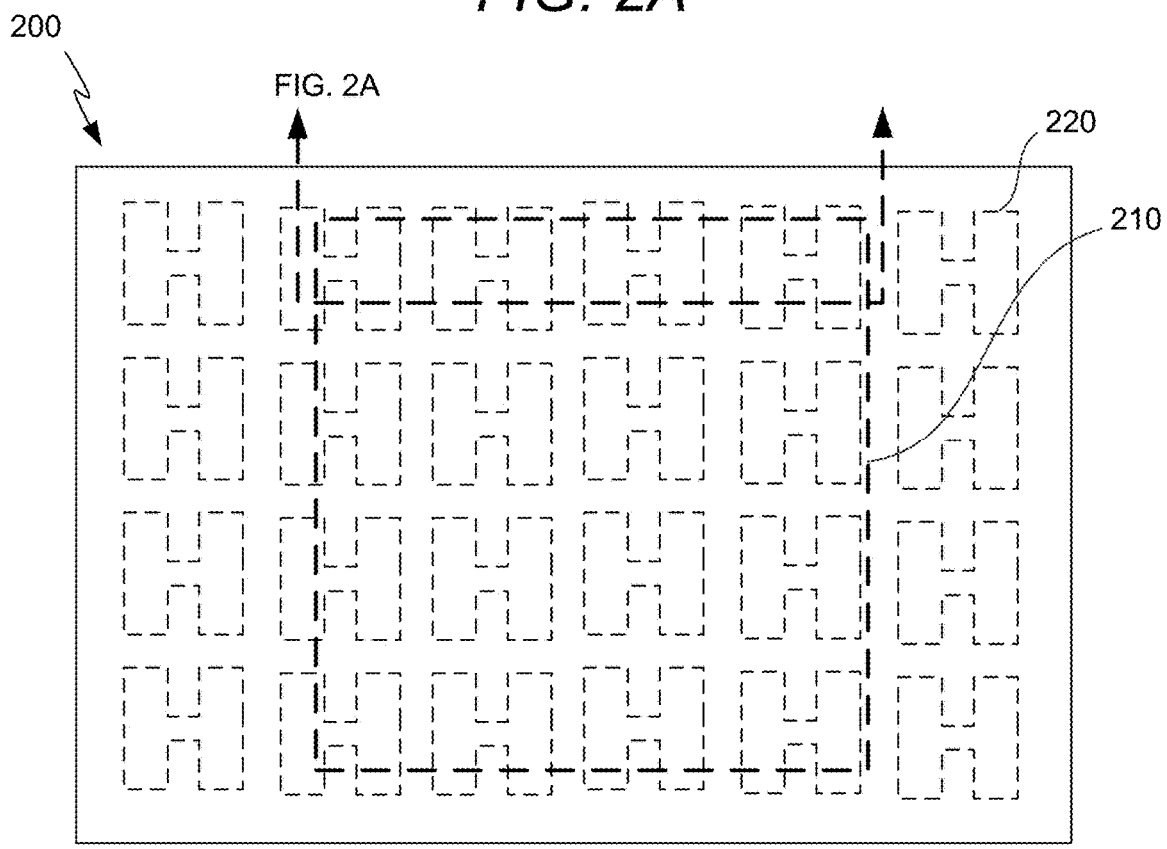
FIG. 2B is simplified top view of the sample depicted in FIG. 2A.

To illustrate, reference is made to FIGS. 2A and 2B and to FIGS. 3A-3L. FIG. 2A is a simplified cross-sectional view of a sample 200 having a region of interest (ROI) 210 (sometimes referred to herein as a "frame") that can be evaluated according to embodiments herein and FIG. 2B is simplified top view of sample 200. ROI 210 includes multiple pillars 220 that extend upwards from a bottom, bulk portion 230 of sample 200 towards a top surface. Pillars 220 include a top layer 222 formed from a first material deposited over a second layer 224 formed from a second material, different than the first material. Since first and second layers 222 and 224 are beneath an upper surface of sample 200, they are sometimes referred to herein as buried layers. In some embodiments, pillars 220 can been formed by etching high aspect ratio holes into layers 222, 224 and filling the holes with a third material 226. In this particular sample, the second layer 224 is composed of the same general material as bulk layer 230 and a third material 226 both fills in the spaces between adjacent pillars 220 and forms an upper, unpatterned portion 228 over the pillars.

When ROI 210 is milled in a delayering process, it can be desirable to detect the transition between the different layers in sample 200. For example, it can be desirable to detect the transition from top layer 222 to second layer 224 and/or to detect the transition from second layer 224 to bulk layer 230. Embodiments disclosed herein can both detect the transition between such layers and stop (i.e., endpoint) a milling process once a transition between layers is detected. To illustrate, reference is now made to FIGS. 3A-3L and to FIGS. 4A-4F.

Each of FIGS. 3A-3L includes an illustration of an SEM image on the left side of the figure along with a corresponding brightness histogram of the SEM image on the right side of the figure such that, for each figure, the SEM image and corresponding histogram are in a side-by-side arrangement. Additionally, the images and histograms in FIGS. 3A-3L represent a sequence of delayering steps in which ROI 210 is milled to increasingly deeper depths. Such a delayering sequence can include many dozens or hundreds of individual delayering steps in which a very thin layer (e.g., 20-100 nm) is milled into the sample and, after each of which, an SEM image can be taken.

Figure 3A:
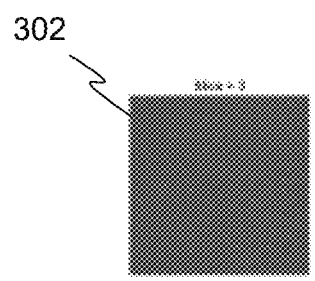
FIGS. 3A-3L include an illustration of an SEM image on the left side of each figure along with a corresponding brightness histogram of the SEM image on the right side of the figure.
Figure 3A:
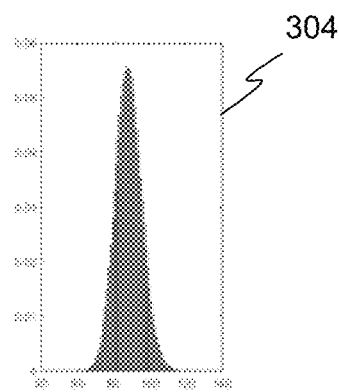

The brightness histogram in each figure shows the number of pixels of at each brightness level in the SEM image. The scale along the bottom of the histogram (the x-axis) goes from left to right, from 0 (0% brightness, i.e., black) to 255 (100% brightness, i.e., white). The y-axis represents the probability of pixel to be in a brightness histogram bar. For example, the maximum probability in FIG. 3A is 0.055, corresponding to a brightness of about 90-91. Thus, the taller the peak, the more pixels there are in the image of the particular brightness. In a typical milling process, ROI 210 can be delayered between 20-80 nm at a time but embodiments are not limited to any particular thickness or depth of each delayering step.

The images and histograms in FIGS. 3A-3L are from a delayering process in which more than eighty delayering steps of sample 200 were performed with each delayering step milling approximately 80 nm from within ROI 210. The images and histograms in FIGS. 3A-3L do not represent successive delayering steps, however, in the process. Instead, the twelve sets of images and histograms in FIGS. 3A-3L have been selected from the larger set of eighty plus images and histograms to illustrate the differences in entropy near transitions between the layers 222, 224 and 230.

Figure 3B:
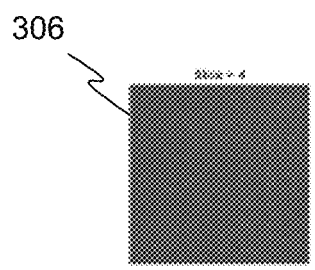
Figure 3B:
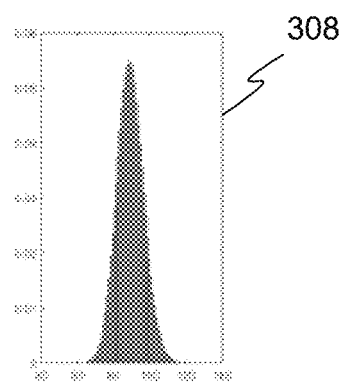
Figure 3C:
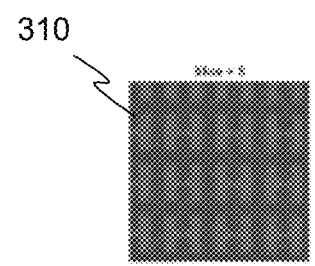
Figure 3C:
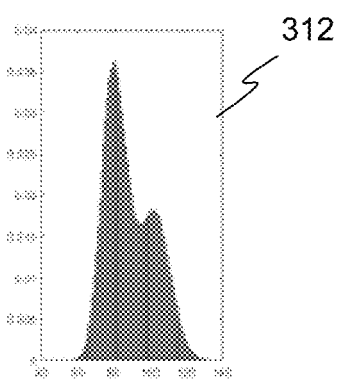
Figure 3D:
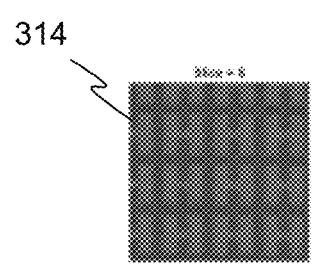
Figure 3D:
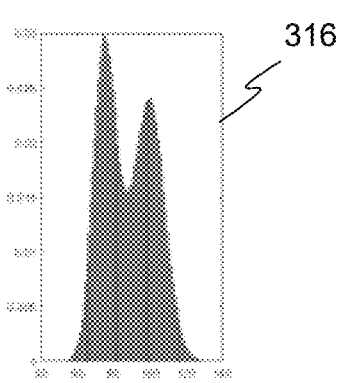
Figure 3E:
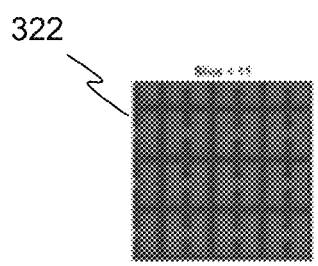
Figure 3E:
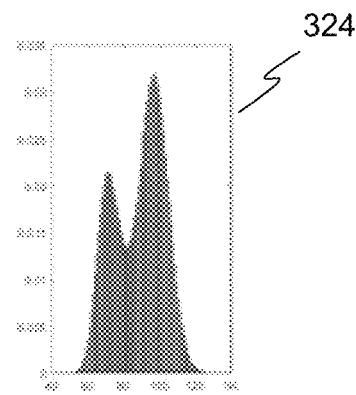
Figure 3F:
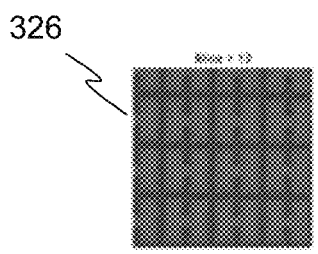
Figure 3F:
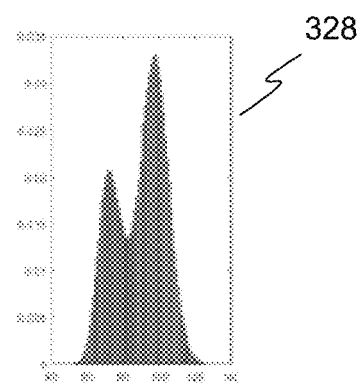
Figure 3G:
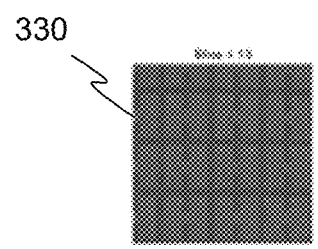
Figure 3G:
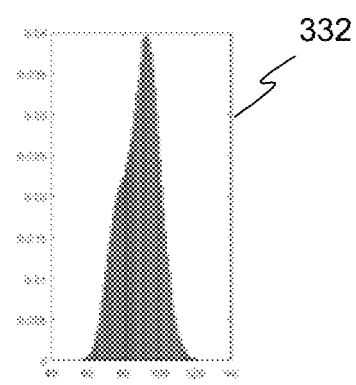
Figure 3H:
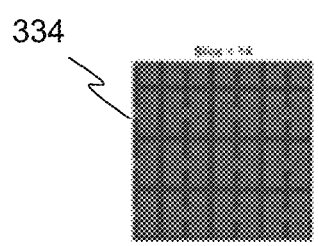
Figure 3H:
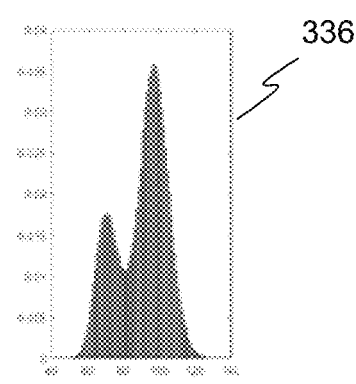
Figure 3I:
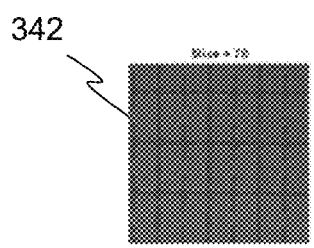
Figure 3I:
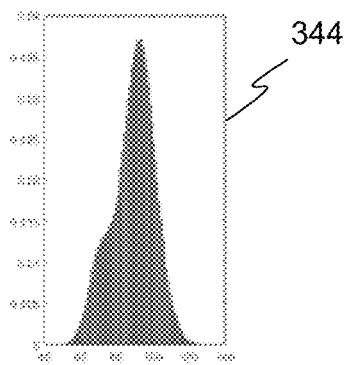
Figure 3J:
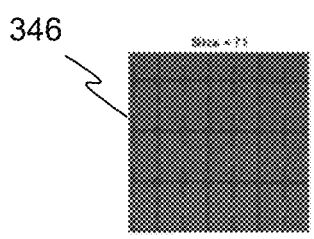
Figure 3J:
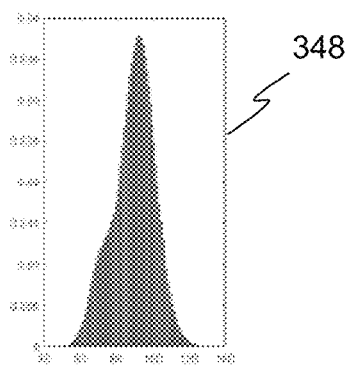
Figure 3K:
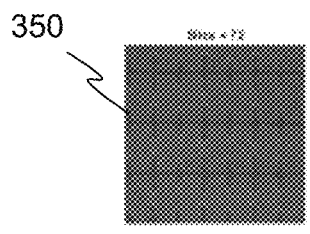
Figure 3K:
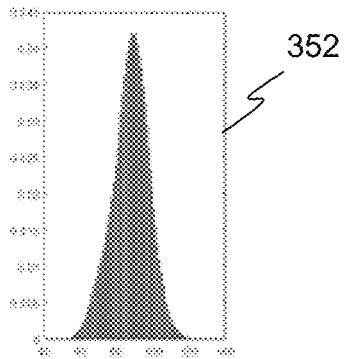
Figure 3L:
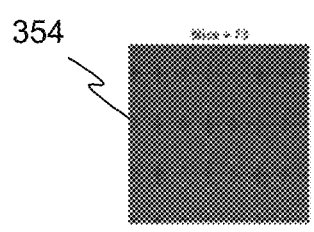
Figure 3L:
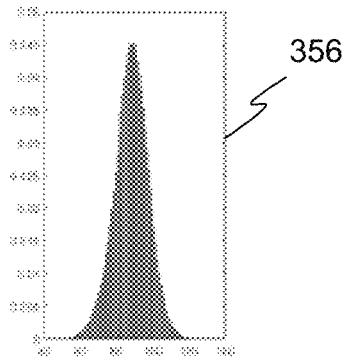
Figure 4A:
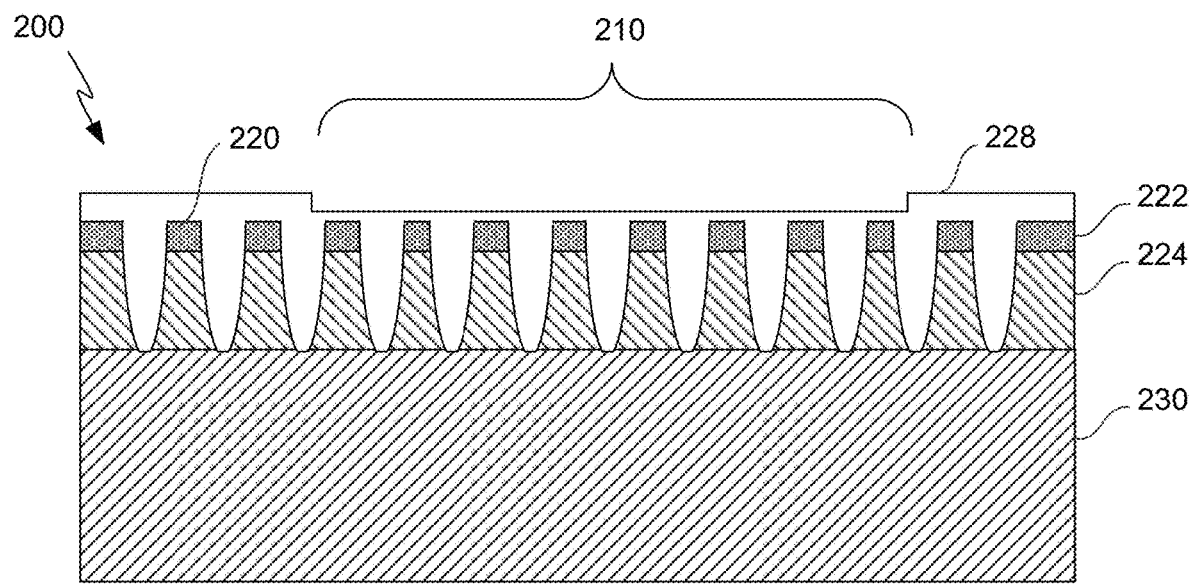
FIGS. 4A-4F are simplified cross-sectional view of a sample at different points in time of a delayering process according to some embodiments.
Figure 4B:
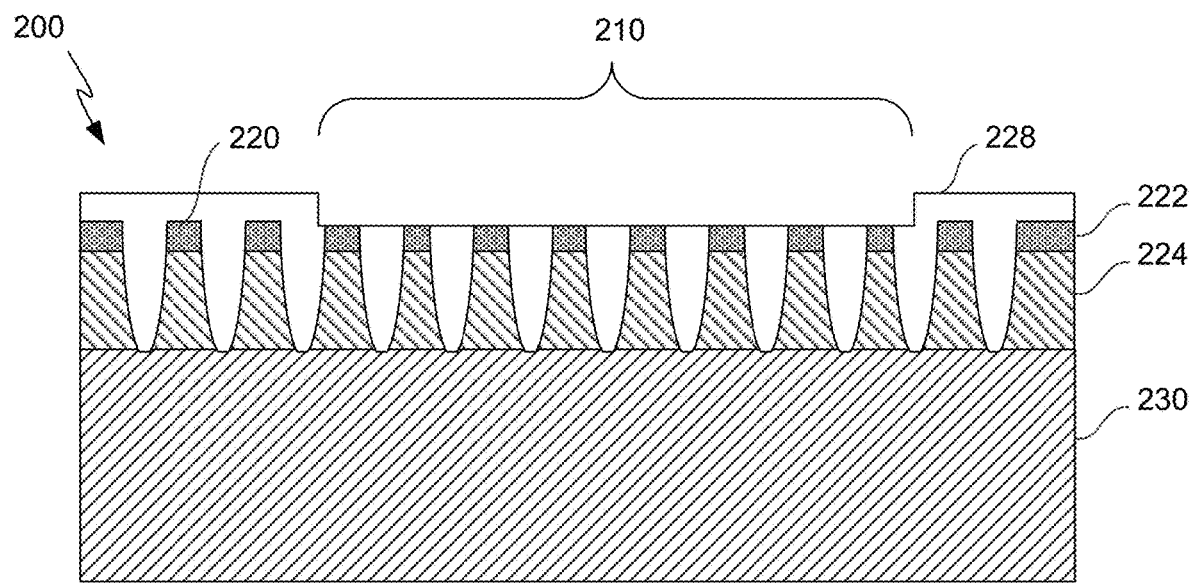
Figure 4C:
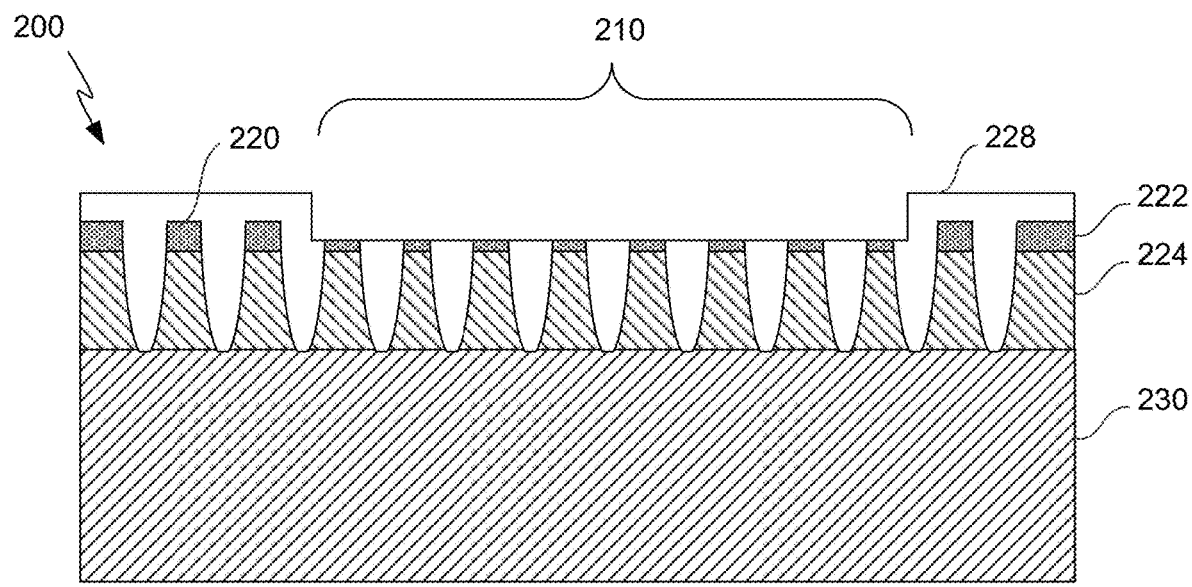
Figure 4D:
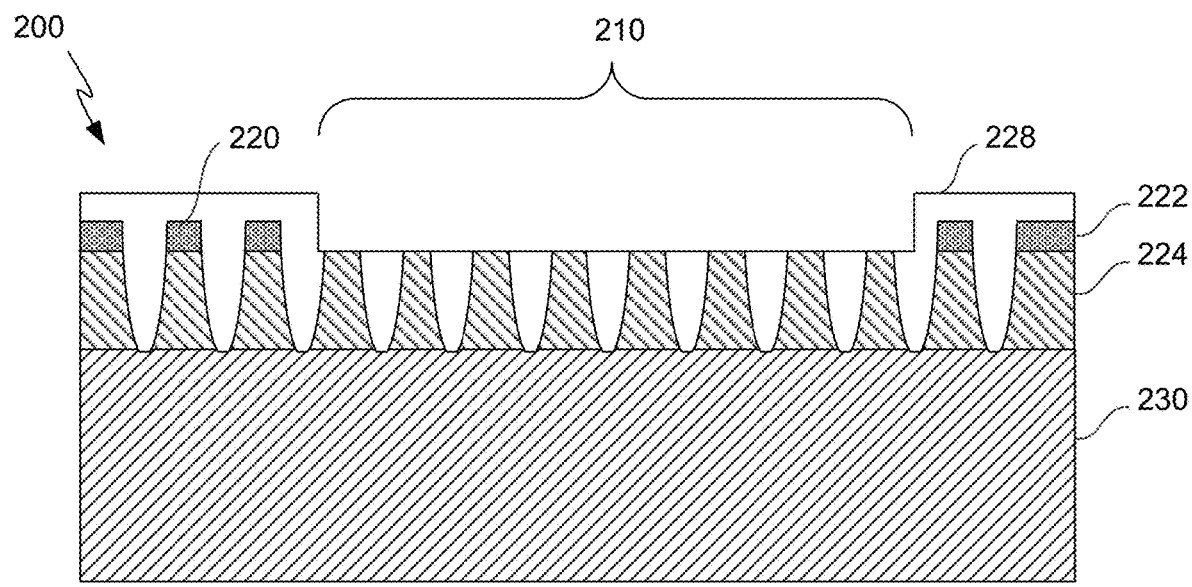
Figure 4E:
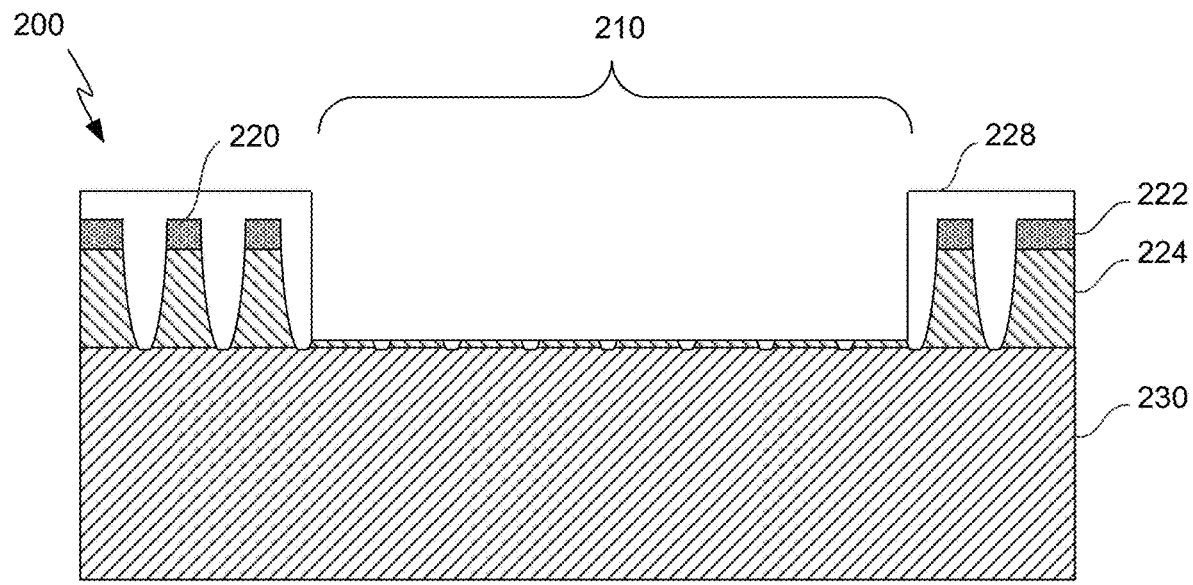
Figure 4F:
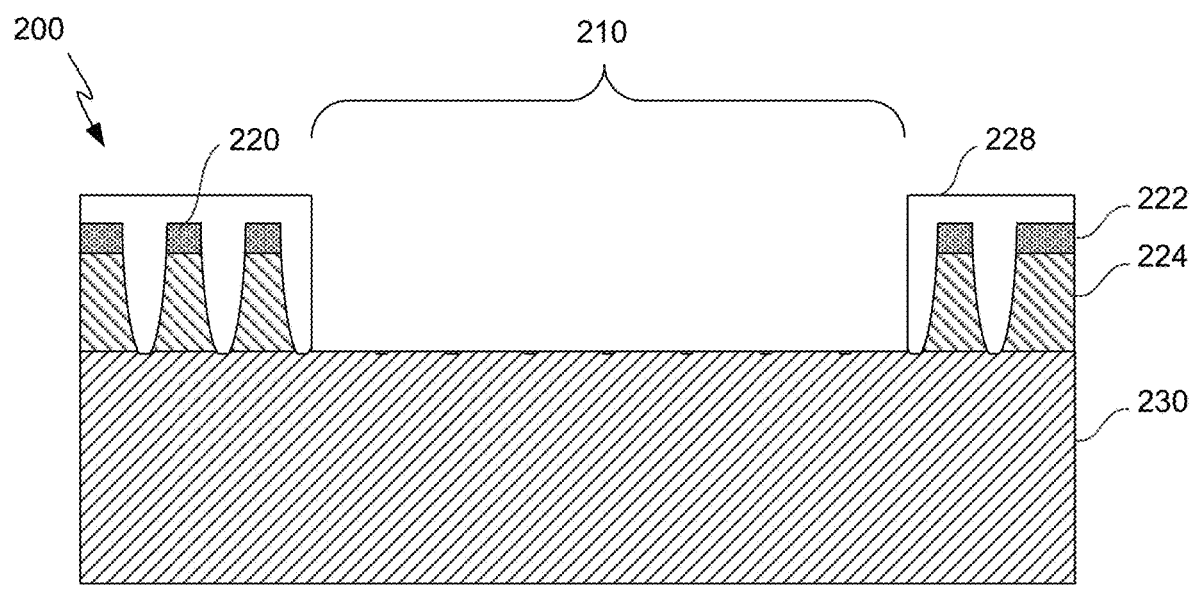

Additionally, FIGS. 4A-4F are simplified cross-sectional views of sample 200 at certain stages of the delayering process depicted in FIGS. 3A-3L. Specifically, FIG. 4A is a cross-sectional view of sample 200 at the delayering step corresponding to FIG. 3B; FIG. 4B is a cross-sectional view of sample 200 at the delayering step corresponding to FIG. 3D; FIG. 4C is a cross-sectional view of sample 200 at the delayering step corresponding to FIG. 3F; FIG. 4D is a cross-sectional view of sample 200 at the delayering step corresponding to FIG. 3H; FIG. 4E is a cross-sectional view of sample 200 at the delayering step corresponding to FIG. 3J; and FIG. 4F is a cross-sectional view of sample 200 at the delayering step corresponding to FIG. 3L.

With this background in mind, FIGS. 3A-3D depict SEM images and corresponding brightness histograms at delayering steps 3, 4, 5 and 6, respectively, of the above-described delayering process. As shown in FIGS. 3A, 3B and 4A, at delayering steps 3 and 4, the delayering process is milling through top layer 228 of the sample and brightness histograms 304, 306 each include a single peak indicative of the constant texture of layer 228 across the surface of the sample. A second peak begins to appear in brightness histogram 312 (FIG. 3C, delayering step 5) indicating the delayering process is starting to reach the beginning of layer 222 which can be seen in SEM image 310 in the form of H-shaped pillars. The second peak is more prominent in histogram 316 (FIG. 3D, delayering step 6) and the H-shaped pillars 220 are more clearly visible in SEM image 314.

FIGS. 3E-3H depict SEM images and corresponding brightness histograms at delayering steps 11, 12, 13 and 14, respectively, of the above-described delayering process. As the delayering process mills deeper into sample 200 through layer 222 (FIG. 4C), the peaks in the brightness histogram change as evident in brightness histograms 324, 428, 332 and 336 (FIGS. 3E-3H) indicating that the milling process has reached layer 224 (FIG. 4D).

FIGS. 3I-3L depict SEM images and corresponding brightness histograms at delayering steps 70, 71, 72 and 73, respectively, of the above-described delayering process. As the delayering process continues to mill deeper into sample 200 through layer 224 (FIG. 4E), the second peak in the brightness histograms starts to disappear as evident in brightness histograms 344, 348, 352 and 356 (FIGS. 3K-3L) indicating that the milling process has reached bulk layer 230 (FIG. 4F).

Figure 5A:
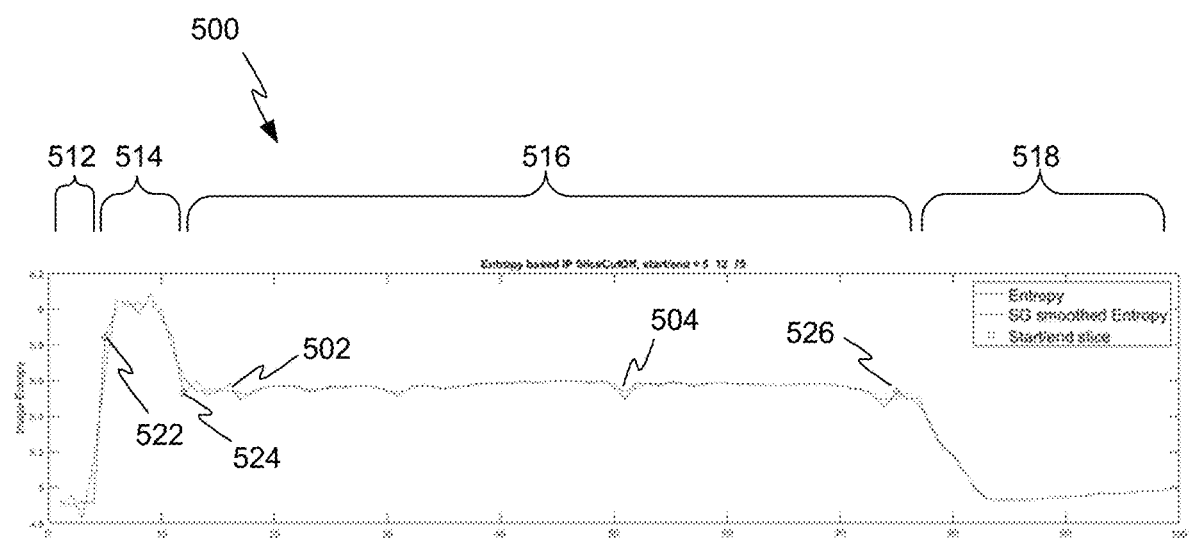
FIG. 5A is a graph plotting the entropy for a plurality of gray scale SEM images in accordance with some embodiments.
Figure 5B:
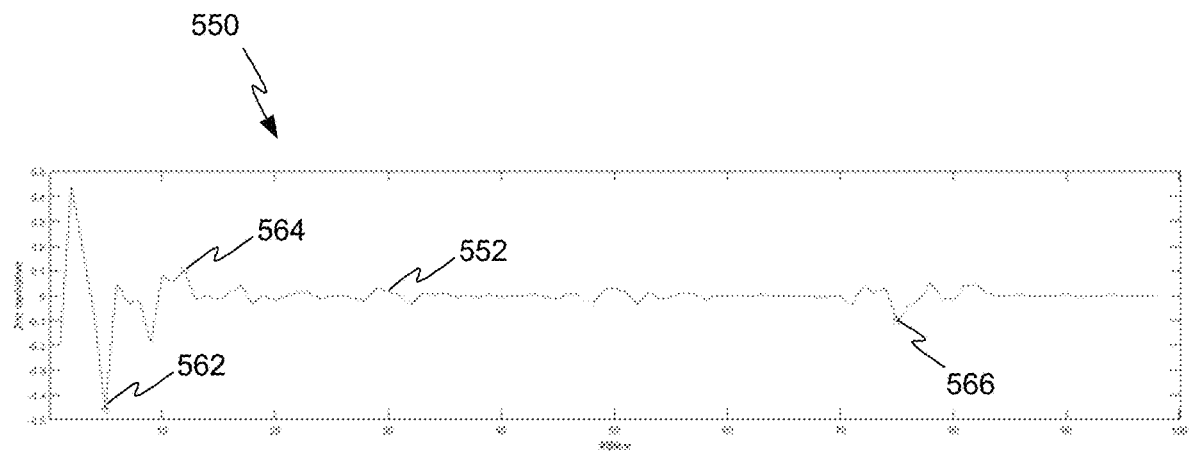
FIG. 5B is a graph depicting the second derivative of the smoothed entropy function depicted in FIG. 5A according to some embodiments.

Instead of evaluating the histograms directly to detect the transition between layers, embodiments disclosed herein calculate the entropy of each gray scale SEM image taken during the delayering process and then calculate the second derivative of a smoothed function of the entropy. To illustrate, reference is made to FIGS. 5A and 5B. FIG. 5A is a graph 500 plotting the entropy (as calculated by the MATLAB function) for each gray scale SEM image captured during the above described delayering process. Graph 500 includes both a direct plot 502 of the calculated entropy at each slice and a smoothed function 504. The x-axis in graph 500 represents the delayered slice number and the y-axis represents the calculated entropy. FIG. 5B is a graph 550 depicting the second derivative 552 of smoothed function 504 where the x-axis represents the delayered slice number and the y-axis a calculated value. In some embodiments, the smoothed function can be done by applying a Savitzky-Golay filter two times: once on the entropy signal before calculating the first derivate, and then a second time on the first derivate before calculating the second derivate.

As illustrated in FIG. 5A, roughly speaking, the area represented within region 512 corresponds to layer 228, the area within region 514 corresponds to layer 222, the area within region 516 corresponds to layer 224 and the area within region 518 corresponds to bulk layer 230. The transitions between the layers (the end of one layer and start of the next layer) is indicated by points 522, 524 and 526. The same transitions between layers can be readily identify in graph 550 by minima and maxima of the second derivative entropy graph that identify changes in trends of the calculated entropy. For example, the transition from layer 228 to 222 is identified by minima 562, the transition between layer 222 and 224 is identified by maxima 564 and the transition from layer 224 to bulk layer 530 is identified by minima 566. Accordingly, FIG. 5B and graph 550 demonstrates that the second derivative of entropy can useful in identifying the transition between layers and thus can be useful in end pointing a milling process. In embodiments, a few training sets (e.g., less than five) can be performed on test samples in order to learn which minima/maxima represent transition points.

Delayering Process for Sample Evaluation

Figure 6:
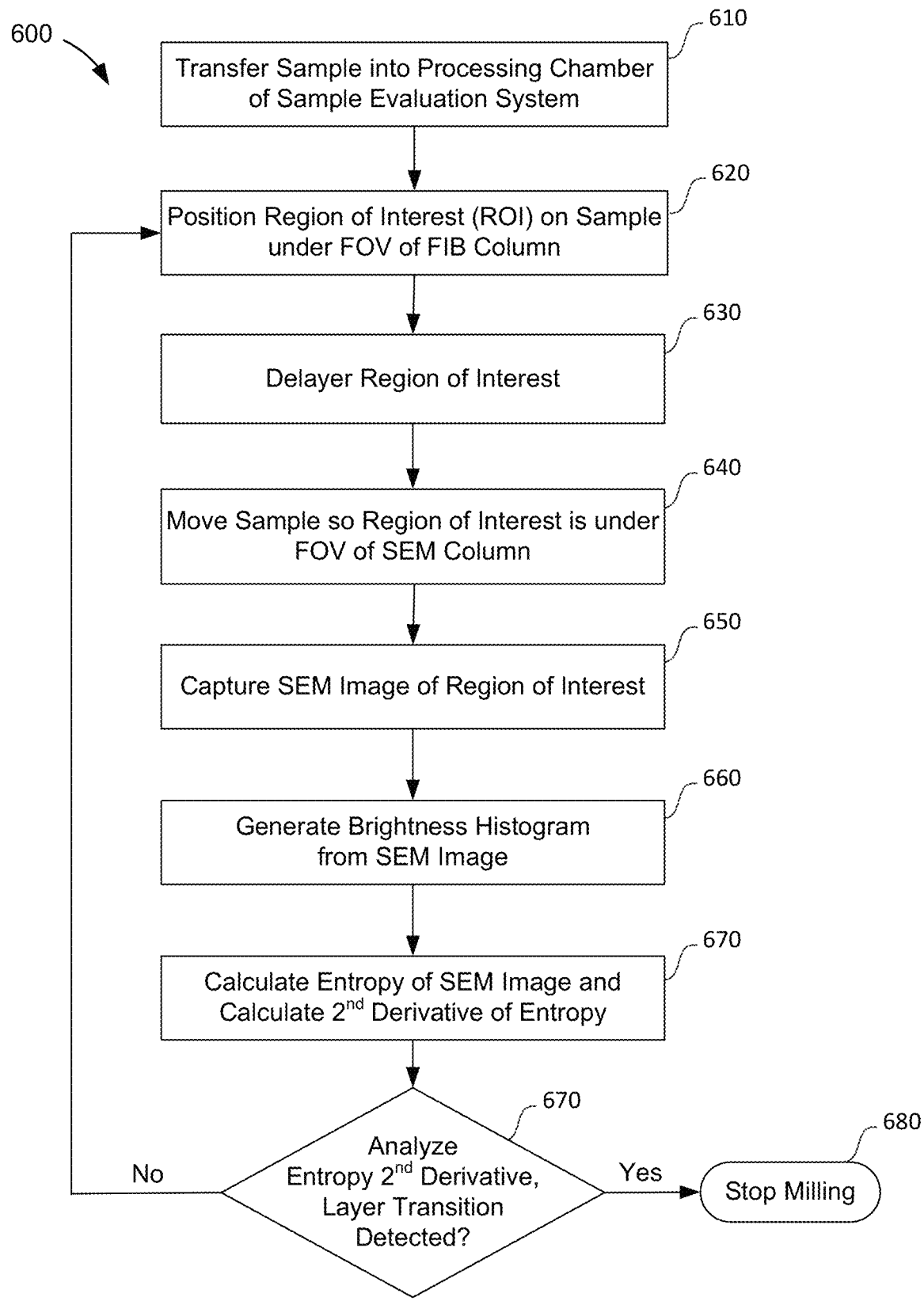
FIG. 6 is a flowchart depicting steps associated with a method in accordance with some embodiments.

While the above discussion explained how entropy can be used to end point a milling process, reference is now made to FIG. 6, which is a flowchart depicting a method 600 of a sample evaluation process in accordance with some embodiments. Method 600 includes delayering a sample that includes a top layer and a second layer buried beneath the top layer. Additionally, method 600 intends to stop (end point) the delayering process once it determines that the delayering process has reached the second (buried) layer (or after milling one or a few more slices as an intended overshot after determining the delayering process reached the second layer). Method 600 can be carried out, for example, by evaluation system 100 discussed above with respect to FIG. 1 or a similar system.

As shown in FIG. 6, method 600 can start by transferring a sample into the processing chamber (block 610) and positioning the sample within a field of view of a focused ion beam (FIB) column (block 620). Next, a delayering process can be performed (block 630) by scanning a charged particle beam across a region of interest (ROI) of the sample. Each iteration of the scanning process removes a very thin layer from the sample. Thus, in order to delayer a desired thickness of the sample (e.g., 20-100 nm), the charged particle beam can be scanned across the ROI multiple times (e.g., hundreds or thousands of times) to remove additional material prior to an imaging step.

Once the ROI has been delayered, the sample is moved away from the FIB column into the field of view of the scanning electron microscope (SEM) column (block 640) where the ROI can be scanned with an electron beam and an SEM image of the ROI can be captured (block 650).

Embodiments disclosed herein can then generate a brightness histogram of the SEM image (block 660) and calculate both the entropy of the image and the second derivative of the entropy (block 660) as discussed above. The calculated second derivative can be reviewed to determine if an appropriate minima or maxima has been reached indicating a transition from the top layer to the second layer (block 670). If a transition to the second layer is detected, method 600 can stop (end point) the milling process (block 680 and conduct additional evaluation steps on the portion of the second layer that is now exposed within the ROI by the milling process. As mentioned above, in some instances end pointing the milling process includes stopping the process after milling one or a few more additional slices as an intended overshot after determining the delayering process reached the second layer. If a transition to the second layer is not detected, method 600 repeats blocks 620 to 670 continuing to delayer the sample over multiple iterations until a transition to the second layer is detected.

Example of a Sample to be Milled

Figure 7:
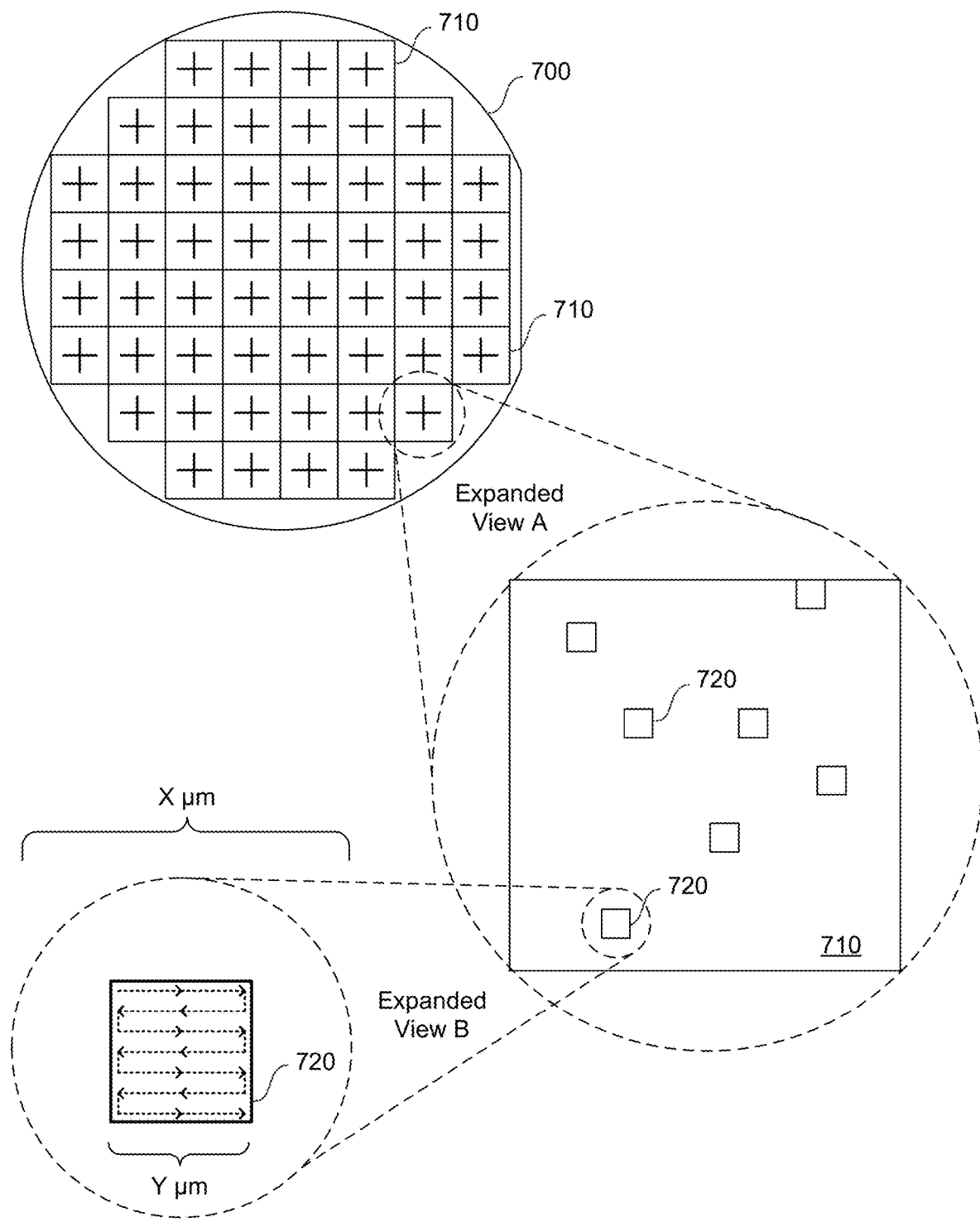
FIG. 7 is a simplified illustration of an area on a semiconductor wafer that can be delayered according to some embodiments.

As stated above, embodiments of the disclosure can be used to endpoint a milling process used to analyze many different types of samples including electronic circuits formed on semiconductor structures, solar cells formed on a polycrystalline or other substrate, nanostructures formed on various substrates and the like. As one non-limiting example, FIG. 7 is a simplified illustration of an area on a semiconductor wafer that can be milled according to some embodiments. Specifically, FIG. 7 includes a top view of wafer 700 along with two expanded views of specific portions of wafer 700. Wafer 700 can be, for example, a 150, 200 mm or 300 mm semiconductor wafer and can include multiple integrated circuits 710 (fifty two in the example depicted) formed thereon. The integrated circuits 710 can be at an intermediate stage of fabrication and the milling techniques described herein can be used to evaluate and analyze one or more regions 720 of the integrated circuits Embodiments of the disclosure can analyze and evaluate region 720 by sequentially milling away an uppermost layer of the region. The milling process can mill region 720 by scanning the FIB back and forth within the region according to a raster pattern until an endpoint of the milling process is determined using the techniques described above.

Additional Embodiments

As described above, embodiments of the disclosure pertain to techniques that enable the transition between two different layers in sample to be detected while delayering materials or regions of a sample based on changes in the second derivative of the brightness entropy of SEM images taken at multiple intervals during the delayering process. The foregoing description was for purposes of explanation only and used specific nomenclature to provide a thorough understanding of the described embodiments. However, it will be apparent to one skilled in the art that the specific details are not required in order to practice the described embodiments. Thus, the foregoing descriptions of the specific embodiments described herein are not intended to be exhaustive or to limit the embodiments to the precise forms disclosed.

Additionally, while different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings. Also, any reference in the specification above to a method should be applied mutatis mutandis to a system capable of executing the method and should be applied mutatis mutandis to a computer program product that stores instructions that once executed result in the execution of the method. Similarly, any reference in the specification above to a system should be applied mutatis mutandis to a method that may be executed by the system should be applied mutatis mutandis to a computer program product that stores instructions that can be executed by the system; and any reference in the specification to a computer program product should be applied mutatis mutandis to a method that may be executed when executing instructions stored in the computer program product and should be applied mutandis to a system that is configured to executing instructions stored in the computer program product.

Because the illustrated embodiments of the present disclosure may for the most part, be implemented using electronic components and equipment known to those skilled in the art, details of such are not be explained in any greater extent than that considered necessary as illustrated above, for the understanding and appreciation of the underlying concepts of the present disclosure and in order not to obfuscate or distract from the teachings of the present disclosure.

What is claimed is:

1. A method of delayering a sample that includes a second layer formed under a first layer, where the first and second layers are different materials or different textures, the method comprising:
    acquiring a plurality of gray scale images of a region of interest in an iterative process by alternating a sequence of delayering the region of interest with a first charged particle beam and imaging a surface of the region of interest with a second charged particle beam;
    after each iteration of acquiring a gray scale image, calculating an entropy of the acquired gray scale image and calculating a second derivative of the entropy;
    determining whether a transition from the first layer to the second layer occurred based on the second derivative of the entropy; and
        if it is determined that a transition from the first layer to the second layer did not occur, proceeding with a next iteration of acquiring a plurality of gray scale images, and if it is determined that a transition from the first layer to the second layer did occurred, end pointing the delayering process.

2. The method of delayering a sample set forth in claim 1 further comprising, after each iteration of acquiring a gray scale image, calculating a brightness histogram of the gray scale image; and
    wherein the entropy of the gray scale image is calculated from brightness histogram.

3. The method of delayering a sample set forth in claim 2 further comprising, after calculating an entropy of a gray scale image, calculating a smoothed function of the entropy for the gray scale images acquired during and prior to the current iteration.

4. The method of delayering a sample set forth in claim 3 wherein the second derivative of the entropy is calculated at each iteration from the smoothed function of the entropy.

5. The method of delayering a sample set forth in claim 1 wherein transitions from the first layer to the second layer are determined based on minima and maxima in the second derivative of the entropy.

6. The method of delayering a sample set forth in claim 1 wherein end pointing the delayering process includes, after determining that a transition from the first layer to the second layer occurred, milling a predetermined number of additional slices and then stopping the delayering process.

7. The method of delayering a sample set forth in claim 1 wherein the first charged particle beam is an ion beam generated by a focused ion beam column and the second charged particle beam is an electron beam generated by a scanning electron microscope column.

8. The method of delayering a sample set forth in claim 7 further comprising, prior to acquiring the plurality of gray scale images, positioning the sample within a vacuum chamber of an evaluation tool that includes the focused ion beam column and the scanning electron microscope (SEM) column.

9. The method of delayering a sample set forth in claim 7 wherein acquiring the plurality of gray scale images of the region of interest includes moving the sample between the focused ion beam column and scanning electron microscope column during each iteration of the delayering process.

10. The method of delayering a sample set forth in claim 1 wherein the sample is a semiconductor wafer.

11. A method of delayering a sample that includes a second layer formed under a first layer, where the first and second layers are different materials or different textures, the method comprising:
    transferring the sample into a vacuum chamber of an evaluation tool that includes a scanning electron microscope (SEM) column and a focused ion beam (FIB) column;
    performing a plurality of delayering operations and generating a corresponding plurality of gray scale images by:
        (i) positioning the sample under a field of view of the FIB column and delayering a region of interest on the sample by repeatedly scanning a focused ion beam generated by the FIB column across the region of interest;
        (ii) thereafter, positioning the sample so that the region of interest is under a field of view of the SEM column and generating a gray scale SEM image of the region of interest by scanning an electron beam across the region of interest;
        (iii) generating a brightness histogram of the gray scale image;
        (iv) calculating an entropy of the gray scale image from the brightness histogram;
        (v) calculating a smoothed entropy function previous entropy calculations;
        (vi) calculating a second derivative of the entropy from the smoothed entropy function; and
        (vii) determining whether a transition from the first layer to the second layer occurred based on the second derivative of the entropy, and if it is determined that a transition from the first layer to the second layer did not occur, repeating steps (i) to (vii) and if it is determined that a transition from the first layer to the second layer occurred, stopping the delayering process.

12. The method of delayering a sample set forth in claim 11 wherein stopping the delayering process includes, after determining that a transition from the first layer to the second layer occurred, milling a predetermined number of additional slices.

13. A system for delayering a sample, the system comprising:
    a vacuum chamber;
    a sample support configured to hold a sample within the vacuum chamber during a sample evaluation process;
    a focused ion beam (FIB) column configured to direct a first charged particle beam into the vacuum chamber;

a scanning electron microscope (SEM) column configured to direct a second charged particle beam into the vacuum chamber;

a processor and a memory coupled to the processor, the memory including a plurality of computer-readable instructions that, when executed by the processor, cause the system to:

acquire a plurality of gray scale images of a region of interest in an iterative process by alternating a sequence of delayering the region of interest with a first charged particle beam and imaging a surface of the region of interest with a second charged particle beam;

after each iteration of acquiring a gray scale image, calculate an entropy of the acquired gray scale image and calculating a second derivative of the entropy;

determine whether a transition from a first layer to a second layer occurred based on the second derivative of the entropy; and if it is determined that a transition from the first layer to the second layer did not occur, proceed with a next iteration of acquiring a plurality of gray scale images, and if it is determined that a transition from the first layer to the second layer did occurred, end point the delayering process.

14. The system for delayering a sample set forth in claim 13 wherein the plurality of computer-readable instructions, when executed by the processor, further cause the system to, after each iteration of acquiring a gray scale image, calculate a brightness histogram of the gray scale image; and wherein the entropy of the gray scale image is calculated from brightness histogram.

15. The system for delayering a sample set forth in claim 14 wherein the plurality of computer-readable instructions, when executed by the processor, further cause the system to, after calculating an entropy of a gray scale image, calculate a smoothed function of the entropy for the gray scale images acquired during and prior to the current iteration; and wherein the second derivative of the entropy is calculated at each iteration from the smoothed function of the entropy.

16. The system for delayering a sample set forth in claim 13 wherein acquiring the plurality of gray scale images of the region of interest includes moving the sample between the focused ion beam column and scanning electron microscope column during each iteration of the delayering process.

17. A non-transitory computer-readable memory that stores instructions for delayering a sample by:

acquiring a plurality of gray scale images of the region of interest in an iterative process by alternating a sequence of delayering the region of interest with a first charged particle beam and imaging a surface of the region of interest with a second charged particle beam;

after each iteration of acquiring a gray scale image, calculating an entropy of the acquired gray scale image and calculating a second derivative of the entropy;

determining whether a transition from the first layer to the second layer occurred based on the second derivative of the entropy; and if it is determined that a transition from the first layer to the second layer did not occur, proceeding with a next iteration of acquiring a plurality of gray scale images, and if it is determined that a transition from the first layer to the second layer did occurred, end pointing the delayering process.

18. The non-transitory computer-readable memory set forth in claim 17 wherein the stored instructions include instructions to, after each iteration of acquiring a gray scale image, calculate a brightness histogram of the gray scale image; and wherein the entropy of the gray scale image is calculated from brightness histogram.

19. The non-transitory computer-readable memory set forth in claim 18 wherein the stored instructions include instructions to, after calculating an entropy of a gray scale image, calculate a smoothed function of the entropy for the gray scale images acquired during and prior to the current iteration; and wherein the second derivative of the entropy is calculated at each iteration from the smoothed function of the entropy.

20. The non-transitory computer-readable memory set forth in claim 17 wherein the first charged particle beam is an ion beam generated by a focused ion beam column and the second charged particle bean is an electron beam generated by a scanning electron microscope column.

* * * * *